(12) United States Patent
Cheng et al.

(10) Patent No.: US 11,171,223 B2
(45) Date of Patent: *Nov. 9, 2021

(54) METHOD FOR MANUFACTURING SEMICONDUCTOR DEVICE AND INTEGRATED SEMICONDUCTOR DEVICE

(71) Applicant: CSMC TECHNOLOGIES FAB2 CO., LTD., Jiangsu (CN)

(72) Inventors: Shikang Cheng, Wuxi New District (CN); Yan Gu, Wuxi New District (CN); Sen Zhang, Wuxi New District (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/957,600

(22) PCT Filed: Nov. 21, 2018

(86) PCT No.: PCT/CN2018/116666
§ 371 (c)(1),
(2) Date: Jun. 24, 2020

(87) PCT Pub. No.: WO2019/128555
PCT Pub. Date: Jul. 4, 2019

(65) Prior Publication Data
US 2020/0350420 A1    Nov. 5, 2020

(30) Foreign Application Priority Data
Dec. 28, 2017   (CN) .......................... 201711465166.0

(51) Int. Cl.
*H01L 29/66* (2006.01)
*H01L 21/265* (2006.01)
(Continued)

(52) U.S. Cl.
CPC ...... *H01L 29/66712* (2013.01); *H01L 21/266* (2013.01); *H01L 21/26513* (2013.01);
(Continued)

(58) Field of Classification Search
CPC .......... H01L 29/66712; H01L 29/1095; H01L 29/7802; H01L 21/8236; H01L 27/0883
See application file for complete search history.

(56) References Cited

U.S. PATENT DOCUMENTS

2009/0321852 A1*  12/2009  Yoneda ............... H01L 29/0847
                                                            257/409
2016/0233216 A1*   8/2016  Zhang ................. H01L 29/1095

FOREIGN PATENT DOCUMENTS

CN        101127327 A      2/2008
CN        101159267 A      4/2008
(Continued)

OTHER PUBLICATIONS

International Search Report dated Jan. 30, 2019 in the parent Application PCT/CN2018/116666 (2 pages).

*Primary Examiner* — Mohammed R Alam
(74) *Attorney, Agent, or Firm* — Polsinelli PC

(57) ABSTRACT

A method for manufacturing a semiconductor device and an integrated semiconductor device, said method comprising: providing an epitaxial layer having a first region and a second region, forming, in the first region, at least two second doping-type deep wells, and forming, in the second region, at least two second doping-type deep wells; forming a first dielectric island between the second doping-type deep wells and forming a second dielectric island on the second doping-type deep wells; forming a first doping-type trench on two sides of the first dielectric island in the first region; forming a gate structure on the first dielectric island; and forming a separated first doping-type source region by using (Continued)

the second dielectric island as a mask, the first doping-type trench extending, in the first region, transversally to the first doping-type source region.

19 Claims, 4 Drawing Sheets

(51) Int. Cl.
*H01L 21/266* (2006.01)
*H01L 29/08* (2006.01)
*H01L 29/10* (2006.01)
*H01L 29/423* (2006.01)
*H01L 29/78* (2006.01)

(52) U.S. Cl.
CPC ........ *H01L 29/086* (2013.01); *H01L 29/1095* (2013.01); *H01L 29/42364* (2013.01); *H01L 29/7802* (2013.01)

(56) References Cited

FOREIGN PATENT DOCUMENTS

| | | |
|---|---|---|
| CN | 101673743 A | 3/2010 |
| CN | 103872137 A | 6/2014 |
| JP | 2000-323583 A | 11/2000 |

* cited by examiner

METHOD FOR MANUFACTURING SEMICONDUCTOR DEVICE AND INTEGRATED SEMICONDUCTOR DEVICE

CROSS-REFERENCE TO RELATED APPLICATION

This application is a National Phase of International Application PCT/CN2018/116666 filed on Nov. 21, 2018 which claims priority to Chinese Patent Application No. 201711465166.0 entitled "METHOD FOR MANUFACTURING SEMICONDUCTOR DEVICE AND INTERGRATED SEMICONDUCTOR DEVICE", filed on Dec. 28, 2017, which is incorporated herein by reference in their entireties.

TECHNICAL FIELD

The present disclosure relates to the field of semiconductor manufacturing, and particularly relates to a manufacturing method for a semiconductor device and an integrated semiconductor device.

BACKGROUND

Existing semiconductor devices include enhanced semiconductor devices and depletion semiconductor devices, for example, vertical double-diffused metal oxide field effect devices (VDMOS) include enhanced VDMOS devices and depletion VDMOS devices, which have advantages such as good switching performance and low power consumption, and are widely used in LED drivers and power adapters. However, most of these existing semiconductor devices are packaged separately, which leads to disadvantages such as increasing the process costs and the chip area being excessively large.

SUMMARY

A manufacturing method for a semiconductor device and an integrated semiconductor device are provided according to various embodiments of the present disclosure.

A manufacturing method for a semiconductor device, includes:

providing a first dopant type semiconductor substrate, forming a first dopant type epitaxial layer having a first region and a second region on a front surface of the first dopant type semiconductor substrate;

forming at least two second dopant type deep wells in each of the first region and the second region, respectively;

forming a plurality of dielectric islands on the first dopant type epitaxial layer, the dielectric islands include first dielectric islands and second dielectric islands; a part of the first dielectric islands covers a region between two adjacent second dopant type deep wells in the first region, and the other part of the first dielectric islands covers a region between two adjacent second dopant type deep wells in the second region; the first dielectric islands are not in contact with the two adjacent second dopant type deep wells; a part of the second dielectric islands covers part of a region of each of the second dopant type deep wells in the first region, and the other part of the second dielectric islands covers part of a region of each of the second dopant type deep wells in the second region; and the second dopant type deep wells at both sides of each of the second dielectric islands in the first region and the second dopant type deep wells at both sides of each of the second dielectric islands in the second region are regions where first dopant type source regions are to be formed;

forming first dopant type trenches respectively on the epitaxial layer at both sides of the first dielectric island in the first region, the first dopant type trenches extend to the regions in the first region where first dopant type source regions are to be formed;

forming gate structures respectively covering the first dielectric islands located in the first region and the second region and on the first dopant type epitaxial layer, the gate structures expose the second dielectric islands and the regions respectively in the first region and in the second region where first dopant type source regions are to be formed; and performing ion implantation for the first dopant type source regions using the gate structures and the second dielectric islands as a mask to form the first dopant type source regions respectively in the first region and in the second region;

the first dopant type and the second dopant type are opposite.

The present disclosure further provides an integrated semiconductor device, and the integrated semiconductor device includes a semiconductor device manufactured by the above described manufacturing method for a semiconductor device.

BRIEF DESCRIPTION OF THE DRAWINGS

To better describe and illustrate embodiments and/or examples of the disclosure disclosed herein, reference can be made to one or more accompanying drawings. The additional details or examples configured to describe the accompanying drawings should not be construed as limiting the scope of any of the disclosed disclosure, the presently described embodiments and/or examples, and the presently understood preferred mode of the disclosure.

DETAILED DESCRIPTION

To facilitate understanding the present disclosure, the present disclosure will be described more fully hereinafter with reference to the accompanying drawings. Preferable embodiments of the present disclosure are presented in the accompanying drawings. However, the present disclosure may be embodied in many different forms and is not limited to the embodiments described herein. Rather, these embodiments are provided so that the disclosure of the present disclosure will be more thorough and complete.

All technical and scientific terms used herein have the same meaning as commonly understood by one of ordinary skill in the art to which the present disclosure applies, unless otherwise defined. The terms used in the specification of this disclosure herein are for the purpose of describing specific embodiments only and are not intended to limit this disclosure. The term "and/or" used herein includes any and all combinations of one or more of the associated listed items.

In order to thoroughly understand the present disclosure, detailed steps and/or detailed structures will be set forth in the following description, so as to explain the technical solutions proposed by the present disclosure. Preferred embodiments of the present disclosure are described in detail below, however in addition to these detailed descriptions, the present disclosure may have other embodiments.

The manufacturing method for a semiconductor device and the integrated semiconductor device of the present disclosure will be described below by taking the manufacturing process of a VDMOS semiconductor device as an example. It should be understood that this embodiment being described using the manufacturing process of a VDMOS semiconductor device as an example is just illustrative, any manufacturing methods for a semiconductor device integrating a depletion device are applicable to the present disclosure.

Embodiment 1

The manufacturing method for a semiconductor device and the semiconductor device proposed in the present disclosure will be described illustratively below with reference to FIGS. 1A-1G, and FIG. 2. FIGS. 1A-1G are schematic diagrams of a semiconductor device formed according to a manufacturing method for a semiconductor device of the present disclosure. FIG. 2 is a flow chart of the manufacturing method for a semiconductor device according to an embodiment of the present disclosure.

Firstly, referring to FIG. 2, at step S1: provide a first dopant type semiconductor substrate, and form a first dopant type epitaxial layer having a first region and a second region on a front surface of the first dopant type semiconductor substrate.

Figure 1A:
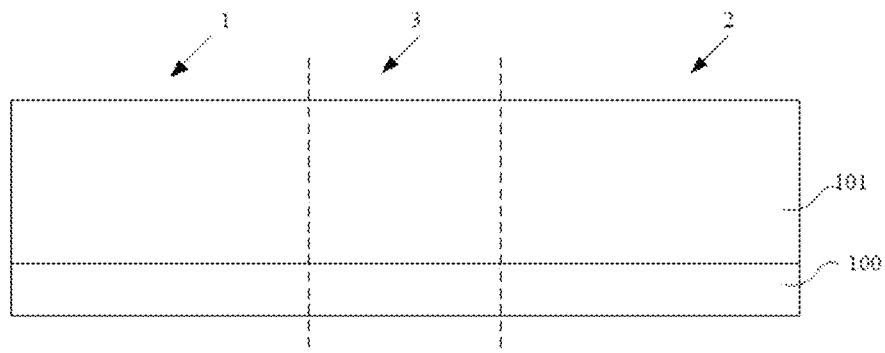
FIGS. 1A-1G are schematic diagrams of a semiconductor device formed according to a manufacturing method for a semiconductor device according to an embodiment of the present disclosure.
Figure 2:
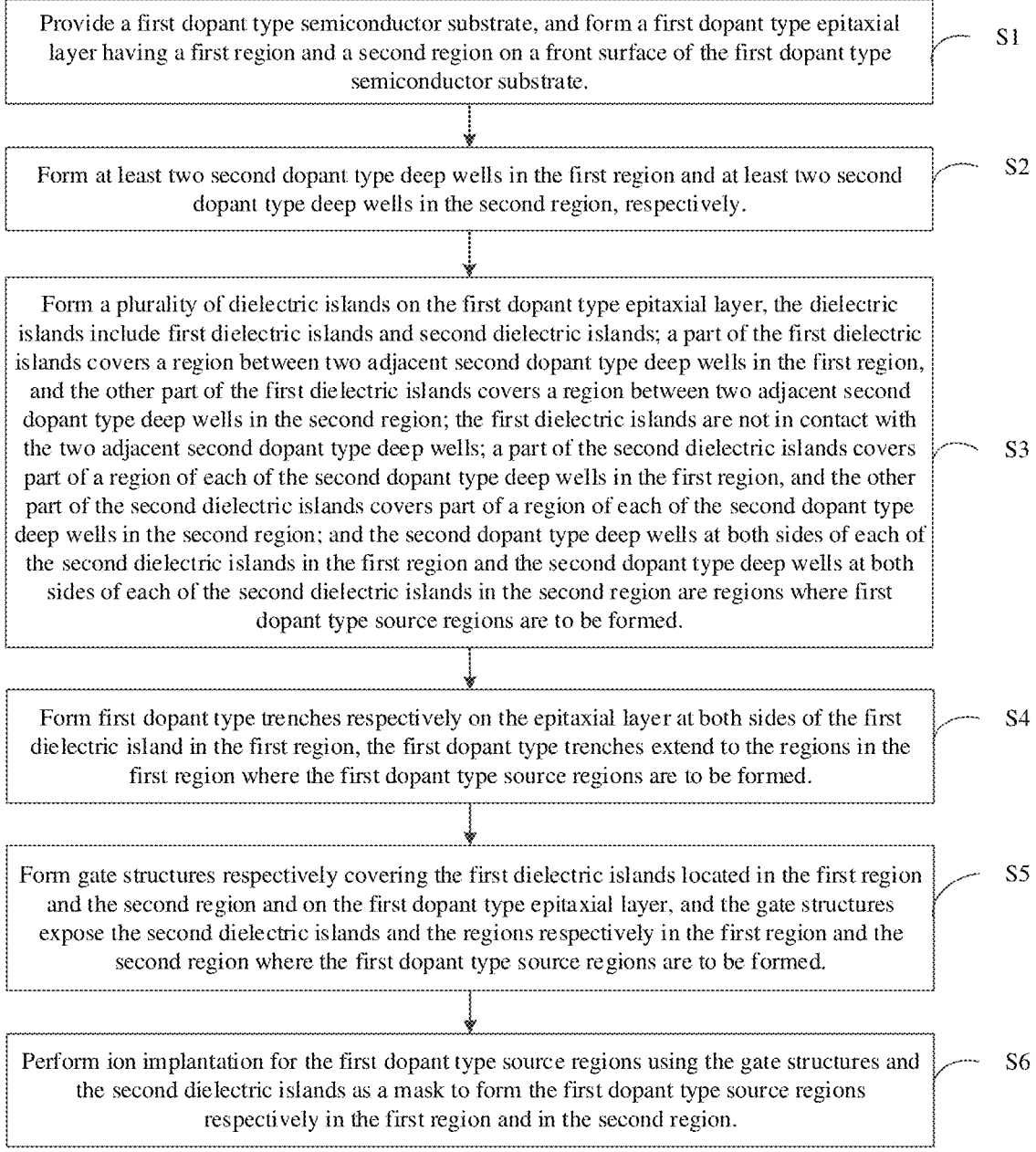
FIG. 2 is a flow chart of the manufacturing method for a semiconductor device according to an embodiment of the present disclosure.

As shown in FIG. 1A, a first dopant type semiconductor substrate 100 is provided. Specifically, the first dopant type semiconductor substrate 100 can be at least one of the following mentioned materials: Si, Ge, SiGe, SiC, SiGeC, InAs, GaAs, InP, InGaAs, or other III/V compound semiconductors, or it includes multilayer structures made of these semiconductors, or it is silicon on insulator (SOI), stacked silicon on insulator (SSOI), stacked silicon germanium on insulator (S-SiGeOI), silicon germanium on insulator (SiGeOI), germanium on insulator (GeOI), and the like.

It should be noted that the first dopant type and the second dopant type in this specification generally refer to P type or N type. The first dopant type and the second dopant type are opposite. For example, the first dopant type is one of P type, lightly doped P− type, and heavily doped P+ type, and the second dopant type is one of N type, lightly doped N− type, and heavily doped N+ type. Or conversely, the first dopant type is one of N type, lightly doped N− type, and heavily doped N+ type, and the second dopant type is one of P type, lightly doped P− type, and heavily doped P+ type. Exemplarily, the first dopant type semiconductor substrate is an N type lightly doped substrate, that is, an N− substrate, and preferably, its doping concentration is $1 \times 10^{14}/cm^3$ to $2 \times 10^{14}/cm^3$.

A first dopant type epitaxial layer having a first region and a second region is formed on the first dopant type semiconductor substrate.

Referring to FIG. 1A, a first dopant type epitaxial layer 101 is formed on a front surface of the first dopant type semiconductor substrate 100, and the first dopant type epitaxial layer 101 includes a first region 1 and a second region 2. The method for forming the first dopant type epitaxial layer 101 includes any of the methods known to those skilled in the art, such as ion doping vapor phase epitaxy. In this embodiment, the first dopant type semiconductor substrate is an N type lightly doped substrate, that is, an N− substrate, and the first dopant type epitaxial layer is an N type lightly doped epitaxial layer, that is, an N− epitaxial layer.

Exemplarily, a thickness and a resistivity of the first dopant type epitaxial layer 101 will affect a voltage withstand capability of the device. The thicker the thickness of the first dopant type epitaxial layer 101, the greater the resistivity thereof, and the higher the voltage withstand capability of the device. In this embodiment, when the withstand voltage of the formed VDMOS semiconductor device is required to be 650V, the thickness of the first dopant type epitaxial layer 101 is 45 μm to 65 μm, and the resistivity thereof is 15 Ω·cm to 25 Ω·cm.

Exemplarily, the first dopant type epitaxial layer 101 further includes a third region 3, and the third region 3 is located between the first region 1 and the second region 2. Exemplarily, a depletion semiconductor device is formed in the first region 1, an enhanced semiconductor device is formed in the second region 2, and an isolation structure configured to isolate the semiconductor device formed in the first region 1 from the semiconductor device formed in the second region 2 is formed in the third region 3.

Next, at step S2: form at least two second dopant type deep wells in the first region and at least two second dopant type deep wells in the second region, respectively.

Figure 1B:
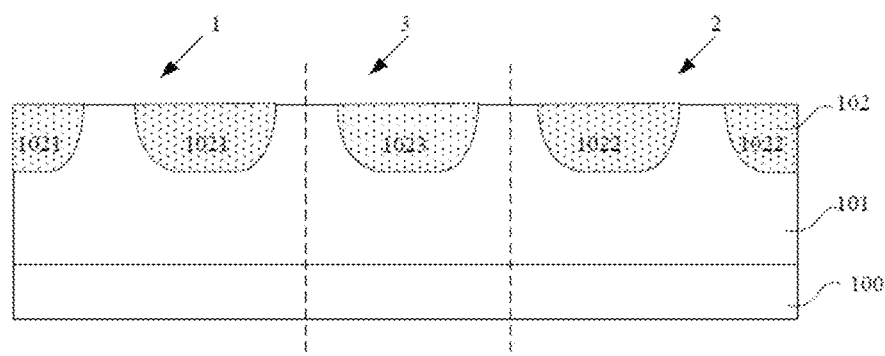

Referring to FIG. 1B, second dopant type deep wells 102 are formed in the first dopant type epitaxial layer 101, the second dopant type deep wells 102 include at least two second dopant type deep wells 1021 located in the first region 1 and at least two second dopant type deep wells 1022 located in the second region 2. In this embodiment, as shown in FIG. 1B, the first dopant type epitaxial layer 101 further includes a third region 3, and at least one second dopant type deep well 1023 located in the third region 3 will be further formed in this step.

A method for forming the second dopant type deep wells includes: form a patterned mask layer on the first dopant type epitaxial layer, the patterned mask layer exposes regions where the second dopant type deep wells are to be formed; perform an ion implantation for the second dopant type deep wells to form second dopant type deep wells on the first dopant type epitaxial layer; and remove the patterned mask layer.

In this embodiment, the first dopant type semiconductor substrate is an N type lightly doped substrate, that is, an N− substrate, the first dopant type epitaxial layer is an N type lightly doped epitaxial layer, that is, an N− epitaxial layer; the second dopant type deep wells are P wells; the ions of the ion implantation for the second dopant type deep wells are boron ions; and an energy of the implantation is in a range of 50 KeV to 200 KeV, and a dosage of the implantation is in a range of 5.0 E13/cm² to 5.0 E14/cm².

Exemplarily, after the ion implantation for the second dopant type deep wells is completed, the method further includes a step of performing an annealing process to the second dopant type well. Exemplarily, a temperature of the annealing process to the second dopant type well is in a range of 1100° C. to 1200° C., and a time thereof is in a range of 60 min to 300 min.

Next, at step S3: form a plurality of dielectric islands on the first dopant type epitaxial layer, the dielectric islands include first dielectric islands and second dielectric islands; a part of the first dielectric islands covers a region between two adjacent second dopant type deep wells in the first region, and the other part of the first dielectric islands covers a region between two adjacent second dopant type deep wells in the second region; the first dielectric islands are not in contact with the two adjacent second dopant type deep wells; a part of the second dielectric islands covers part of a region of each of the second dopant type deep wells in the first region, and the other part of the second dielectric islands covers part of a region of each of the second dopant type deep wells in the second region; and the second dopant type deep wells at both sides of each of the second dielectric islands in the first region and the second dopant type deep wells at both sides of each of the second dielectric islands in the second region are regions where first dopant type source regions are to be formed.

Figure 1C:
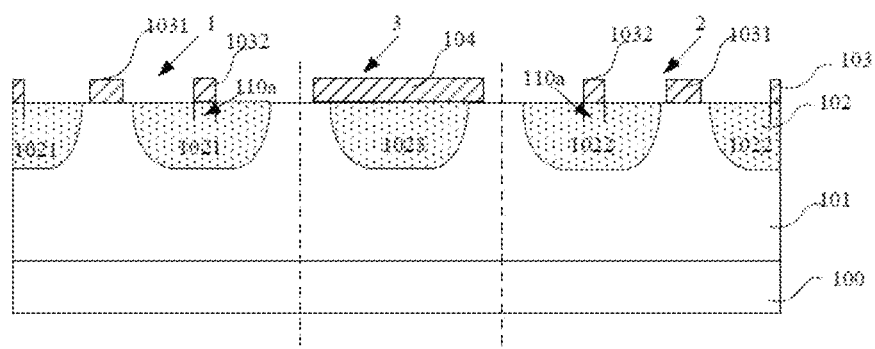

Referring to FIG. 1C, a plurality of dielectric islands 103 are formed on the first dopant type epitaxial layer 101, and the dielectric islands 103 include first dielectric islands 1031 and second dielectric islands 1032. The first dielectric islands 1031 are located on a region between two adjacent second dopant type deep wells 1021 in the first region 1 and located on a region between two adjacent second dopant type deep wells 1022 in the second region 2. And, in the first region 1, the first dielectric island 1031 is not in contact with the two adjacent second dopant type deep wells 1021, and in the second region 2, the first dielectric island 1031 is not in contact with the two adjacent second dopant type deep wells 1022. The second dielectric islands 1032 are located on the second dopant type deep wells 1021 in the first region 1 and on the second dopant type deep wells 1022 in the second region 2. The second dopant type deep wells each include a region 110a covered by one of the second dielectric islands, and the region 110a is located between the first dopant type source regions to be formed, that is, regions of the second dopant type deep wells at both sides of the region 110a are regions where the first dopant type source regions are to be formed.

The first dielectric islands are formed on the region between two adjacent second dopant type deep wells in the first region and on the region between two adjacent second dopant type deep wells in the second region, thus ion implantation is performed using the first dielectric islands as a mask in the process of forming the trenches of the depletion device. This prevents trench ions from entering into the region under the first dielectric island, and minimize the trench ion concentration of the first dopant type epitaxial layer under the dielectric island, so that the depletion device has higher breakdown voltage and its breakdown withstand reliability is greatly improved.

The second dielectric islands are formed on the region between the first dopant type source regions to be formed in the second dopant type deep wells in the first region and the region between the first dopant type source regions to be formed in the second dopant type deep wells in the second region, thus in the process of forming the first dopant type source regions, the second dielectric islands can be used as a mask to form the first dopant type source regions by self-alignment, and the photo mask and the step of performing a photolithography process to obtain the ion implantation mask are saved in the process, so that the process cost is reduced. The step of forming the first dopant type source regions will be further described in the subsequent description.

Exemplarily, the step of forming the dielectric islands includes: perform a deposition on the first dopant type epitaxial layer to form a dielectric island material layer, form a patterned mask layer on the dielectric island material layer, the patterned mask layer covers regions where the dielectric islands are to be formed; then, etch the epitaxial material layer using the patterned mask layer as a mask to form the dielectric islands; and remove the patterned mask layer.

Exemplarily, the dielectric island material layer is a silicon dioxide or a high-k dielectric material layer. Exemplarily, the dielectric island material layer is a silicon oxide layer. Exemplarily, the step of forming a dielectric island material layer includes any of the methods that can form a dielectric island material layer, such as thermal oxidation, chemical vapor deposition, molecular beam epitaxy, and the like. The steps of forming a patterned mask layer and etching the dielectric island material layer using the patterned mask layer as a mask may be any of the methods well known to those skilled in the art, and details are not described herein again.

In this embodiment, a third region is formed in the first dopant type epitaxial layer to isolate the first region from the second region. Exemplarily, during the process of forming the dielectric islands, a field oxygen covering the second dopant type deep well in the third region is formed at the same time. Continuing reference to FIG. 1C, a field oxygen 104 covering the second dopant type deep well in the third region is formed in the third region 3, thereby forming a complete isolation structure located in the third region. The field oxygen is formed during the process of forming the dielectric islands, so that the process flow can be simplified. Exemplarily, the thicknesses of the dielectric islands 103 and the field oxygen 104 are in a range of 5000 Å to 10000 Å, and the lengths of the dielectric islands 103 are in a range of 2 μm to 5 μm.

Next, at step S4: form first dopant type trenches respectively on the epitaxial layer at both sides of the first dielectric island in the first region, the first dopant type trenches extend to the regions in the first region where the first dopant type source regions are to be formed.

Figure 1D:
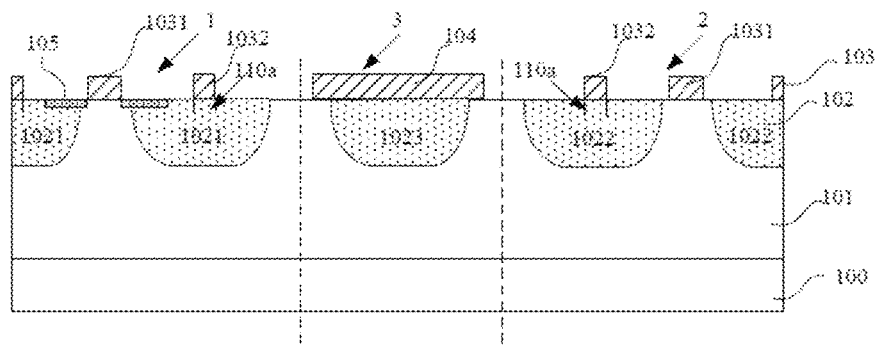

As shown in FIG. 1D, first dopant type trenches 105 located at both sides of the first dielectric island 1031 are formed in the first region 1 of the first dopant type epitaxial layer 101, and the first dopant type trenches 105 extend to regions in the second dopant type deep wells 1021 in the first region 1 where source regions are to be formed.

Exemplarily, the step of forming first dopant type trenches at both sides of the first dielectric island in the first region of the first dopant type epitaxial layer includes: firstly, form a patterned mask layer on the first dopant type epitaxial layer, the patterned mask layer exposes regions at both sides of the first dielectric island where the first dopant type trenches are to be formed; perform an ion implantation for the trenches using the patterned mask layer and the first dielectric island as a mask to form the first dopant type trenches located at both sides of the first dielectric island; and remove the patterned mask layer.

The ions of the ion implantation for the trenches are phosphorus ions, an energy of the implantation is in a range of 50 KeV to 200 KeV, and a dosage of the implantation is in a range of 5.0 E12/cm$^2$ to 5.0 E13/cm$^2$.

In the process of forming the trenches of the depletion device, the ion implantation is performed using the first dielectric islands as a mask, which prevents ions from entering into the region under the first dielectric island, and minimizes the trench ion concentration of the first dopant type epitaxial layer under the dielectric island, so that the depletion device has higher breakdown voltage and its breakdown withstand reliability is greatly improved Exemplarily, after forming the dielectric islands, and before forming first dopant type trenches located at both sides of the dielectric island in the first region, the method further includes a step of performing a threshold voltage (Vt) adjusting implantation to adjust the threshold voltage of the device, and the step of the Vt adjusting implantation is performed by using the dielectric island and/or the field oxygen as a mask. Exemplarily, the ions of the Vt adjusting implantation are phosphorus ions, an energy of the implantation is in a range of 100 KeV to 200 KeV, and a dosage of the implantation is in a range of $1.0\, E12/cm^2$ to $1.0\, E13/cm^2$. Exemplarily, after the step of performing a Vt adjusting implantation, the method further includes a step of performing a second annealing, a temperature of the second annealing is in a range of 1100° C. to 1200° C., and a time of the second annealing is in a range of 60 min to 180 min.

Next, at step S5: form gate structures respectively covering the first dielectric islands located in the first region and the second region and on the first dopant type epitaxial layer, and the gate structures expose the second dielectric islands and the regions respectively in the first region and the second region where the first dopant type source regions are to be formed.

Exemplarily, the gate structures each include a gate dielectric layer and a gate material layer stacked in this order from bottom to top.

Figure 1E:
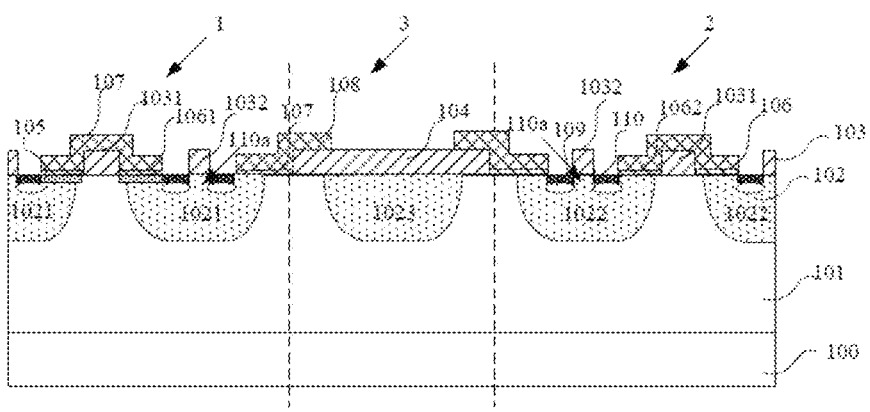

Referring to FIG. 1E, firstly, gate structures 106 are formed on the first dopant type epitaxial layer 101. The gate structures 106 include a gate structure 1061 formed on the first region 1 and a gate structure 1062 formed on the second region 2. The gate structures 106 each include a gate dielectric layer 107 and a gate material layer 108. The gate structure 1061 located on the first region 1 of the gate structures 106 covers the first dielectric island 1031 located in the first region 1, and exposes the second dielectric islands 1032 and regions in the second dopant type deep wells 1021 located in the first region 1 where the first dopant type source regions are to be formed; the gate structure 1062 located on the second region 2 of the gate structures 106 covers the first dielectric island 1031 located in the second region 2, and exposes the second dielectric islands 1032 and regions in the second dopant type deep wells 1022 located in the second region 2 where the first dopant type source regions are to be formed. The first dielectric islands are each covered by one of the gate structures. For an enhanced device, according to the formula $C_{ox}=\varepsilon_{ox}/t_{ox}$, it can be known that the thickness of the gate dielectric layer increases due to the existence of the first dielectric island, which reduces the gate capacitance and reduces the switching loss of the device.

Exemplarily, the gate dielectric layer is a silicon dioxide material, and the gate material layer is a polysilicon material. The method for forming the gate structures can be any of the methods well known to those skilled in the art, for example, the methods include process steps such as deposition, photolithography, and etching, which will not be repeated herein. Exemplarily, a thickness of the gate dielectric layer is in a range of 500 Å to 1500 Å; a thickness of the gate material layer is in a range of 2000 Å to 10000 Å.

Exemplarily, in this embodiment, the first dopant type epitaxial layer further includes a third region that isolates the first region from the second region, and in the third region, the gate material layer covers part of the field oxygen.

Next, at step S6: perform ion implantation for the first dopant type source regions using the gate structures and the second dielectric islands as a mask to form the first dopant type source regions respectively in the first region and in the second region.

With continued reference to FIG. 1E, an ion implantation for the first dopant type source regions is performed using the gate structures 106 and the dielectric islands 103 as a mask to form the first dopant type source regions 110 located at both sides of each of the gate structures in the second dopant type deep wells 1021 of the first region 1 and in the second dopant type deep wells 1022 of the second region 2. The first dopant type source regions 110 located in the second dopant type deep wells 1021 of the first region 1 are in contact with the first dopant type trenches 105, and the first dopant type source regions 110 located in one same second dopant type deep well are spaced apart by a region 110a of part of the second dopant type deep well 102 located under the second dielectric island 1032.

In the method for forming the first dopant type source regions, the ion implantation is performed using the gate structures and the second dielectric islands as a mask. Since the second dielectric islands are formed at regions covering regions between the first dopant type source regions on the second dopant type deep wells in the first region and regions covering regions between the first dopant type source regions on the second dopant type deep wells in the second region, therefore, in the process of forming the first dopant type source regions, the second dielectric islands can be used as a mask to form the first dopant type source regions by self-alignment, so that a photo mask is saved during the process, and thus the process cost is reduced. In this embodiment, the step of ion implantation for forming the first dopant type source regions 110 is a step of phosphorus ion implantation, and an energy of the implantation is in a range of 50 KeV to 150 KeV and a dosage of the implantation is in a range of $5.0\, E15/cm^2$ to $1.0\, E16/cm^2$.

Exemplarily, after forming the first dopant type source regions, second dopant type well regions under the first dopant type source regions are formed. Forming the second dopant type well regions under the first dopant type source regions can significantly reduce the resistance of the base region of the parasitic transistor, greatly reduce the risk of turning on the parasitic transistor, and significantly improve the working stability of the device.

With continued reference to FIG. 1E, second dopant type well regions 109 are formed under the first dopant type source regions 110. In the method for forming the second dopant type well regions, an ion implantation is performed using the gate structures and the second dielectric islands as a mask. In this embodiment, the step of ion implantation for forming the second dopant type well regions 109 is a step of boron ion implantation, an energy of the implantation is in a range of 150 KeV to 300 KeV, and a dosage of the implantation is in a range of $1.0\, E15/cm^2$ to $5.0\, E15/cm^2$.

Exemplarily, after forming the first dopant type source regions, the method further includes a step of forming source electrodes. Exemplarily, the step of forming source electrodes includes: forming a dielectric layer on the first dopant type epitaxial layer, the dielectric layer covers the gate structures and the first dopant type source regions and exposes the second dielectric islands; removing the second dielectric islands and part of the dielectric layer to form openings, the openings expose part of each of the first dopant type source regions located in the second dopant type deep wells and regions located under the second dielectric islands; forming the source electrodes on the first dopant type epitaxial layer, the source electrodes fill the openings, the source electrodes include a first region source electrode and a second region source electrode, the first region source electrode is in contact with the second dopant type deep wells located in the first region and the first dopant type source regions located in the second dopant type deep wells, the second region source electrode is in contact with the second dopant type deep wells located in the second region and the first dopant type source regions located in the second dopant type deep wells, and the first region source electrode is not in contact with the second region source electrode.

Exemplarily, before forming the source electrodes, the method further includes a step of forming second dopant type well regions and second dopant type source regions. The process of forming the source electrodes after forming the second dopant type source regions is described below with reference to FIGS. 1F and 1G.

Figure 1F:
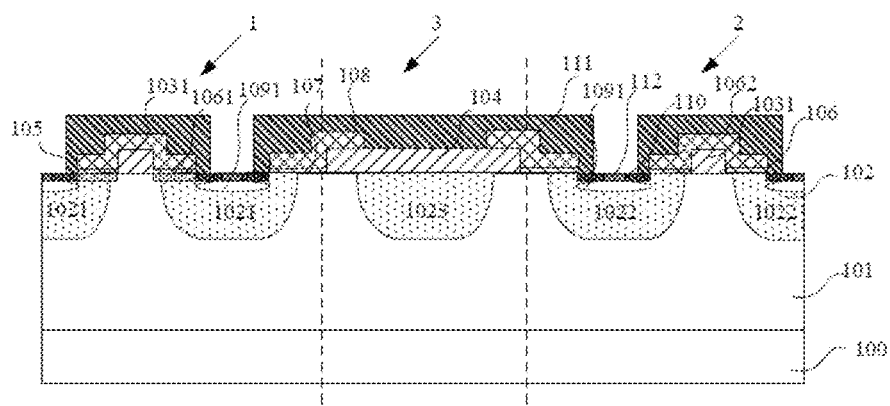

Firstly, referring to FIG. 1F, a dielectric layer covering the gate structures (including the gate dielectric layers 107 and the gate material layers 108) and the first dopant type source regions 110 is formed on the first dopant type epitaxial layer 101, and the dielectric layer exposes the second dielectric islands 1032. The dielectric layer can be a dielectric material layer such as silicon dioxide or silicon nitride. The method for forming the dielectric layer includes steps such as deposition, photolithography, and etching, and these are steps well known to those skilled in the art, which will not be repeated herein. Exemplarily, when the field oxygen 104 is formed on the first dopant type epitaxial layer 101 in the third region 3, the dielectric layer further covers the field oxygen 104 located on the first dopant type epitaxial layer in the third region 3.

Next, with continued reference to FIG. 1F, the second dielectric islands 1032 and part of the dielectric layer are removed to form openings, and the openings expose regions 110a located below the second dielectric islands 1032 and part of each of the first dopant type source regions 110 located in the second dopant type deep wells. The method for removing the second dielectric islands and part of the dielectric layer uses steps well known to those skilled in the art, such as etching, which will not be repeated herein.

Next, with continued reference to FIG. 1F, a step of ion implantation is performed to form second dopant type source regions 112 located between the second dopant type deep wells 1021 of the first region and between the second dopant type deep wells 1022 of the second region, the second dopant type source regions 112 are connected to the first dopant type source regions 112.

In the step of ion implantation for forming the second dopant type source regions, the remaining dielectric layer 111 is used as a mask. In this embodiment, the second dopant type source regions are formed after the dielectric layer is partially removed and before the source electrodes are formed, and a dosage of the ion implantation for forming the second dopant type source regions is less than that of the ion implantation for forming the first dopant type source region, so that during the process of forming the second dopant type source regions, the exposed first dopant type source regions will not be converted into the other type. The second dopant type source regions are configured to enhance the contacts between the source electrodes and the deep wells.

In this process, since the dielectric layer is partially removed to form openings that expose the regions below the first dielectric islands and part of each of the first dopant type source regions before forming the second dopant type source regions, the dielectric islands and the dielectric layer are removed in one step. And the second dopant type source regions are formed directly in the first dopant type source regions by controlling the dosage of the ion implantation for the second dopant type source regions during the formation of the second dopant type source regions. There is no need to separately form an ion implantation mask, thereby further reducing the process steps and saving the process cost.

In this embodiment, the step of the ion implantation for forming the second dopant type source regions is a step of a boron ion implantation or a boron difluoride ion implantation, and an energy of the implantation is in a range of 50 KeV to 200 KeV and a dosage of the implantation is in a range of 5.0 E14/cm$^2$ to 5.0 E15/cm$^2$.

It should be understood that the second dopant type source regions are formed after the dielectric layer is partially removed and before the source electrodes are formed is merely illustrative, and any steps of forming the second dopant type source regions are applicable to the present disclosure.

With continued reference to FIG. 1F, a step of ion implantation is performed to form another second dopant type well regions under the second dopant type source regions 112. The another second dopant type well regions are connected to the second dopant type well regions 109 under the first dopant type source regions 110 to form complete second dopant type well regions 1091 under the first dopant type source regions 110 and the second dopant type source regions 112. In the step of ion implantation for forming another second dopant type well regions, the dielectric layer 111 is used as a mask, and a boron ion implantation process is used, an energy of the implantation is in a range of 150 KeV to 300 KeV, and a dosage of the implantation is in a range of 1.0 E15/cm$^2$ to 1.0 E16/cm$^2$. Exemplarily, an annealing is performed after completing the step of the ion implantation for the another second dopant type well regions. A temperature of the annealing is in a range of 800° C. to 1000° C., and a time of the annealing is in a range of 30 min to 90 min. Forming the second dopant type well regions 1091 under the first dopant type source regions 110 and the second dopant type source regions 112 can significantly reduce the resistance of the base region of the parasitic transistor, greatly reduce the risk of turning on the parasitic transistor, and significantly improve the working stability of the device.

Finally, referring to FIG. 1, source electrodes 113 are formed, the source electrodes 113 include a first region source electrode 1131 and a second region source electrode 1132, the first region source electrode 1131 is in contact with the first dopant type source regions 110 and the second dopant type source regions 112 in the first region 1, the second region source electrode 1132 is in contact with the first dopant type source regions 110 and the second dopant type source regions 112 in the second region 2, and the first region source electrode 1131 is not in contact with the second region source electrode 1132. The source electrodes are made of one of conventional aluminum and copper, or are made of an alloy of several of the conventional aluminum and copper.

The step of forming the source electrodes 113 includes: depositing a source material layer, and patterning the source material layer to form the source electrodes. The steps of etching the dielectric layer, depositing the source material layer, and patterning the source material layer are processes well known to those skilled in the art, which will not be repeated herein.

After the source electrodes are formed, the method further includes a step of forming a drain electrode. Exemplarily, the step of forming the drain electrode includes: firstly, thinning a back surface of the first dopant type semiconductor substrate; and then, depositing the back surface of the first dopant type semiconductor substrate to form the drain electrode. The drain electrode is made of one of conventional aluminum and copper, or is made of an alloy of several of the conventional aluminum and copper. As shown in FIG. 1, the drain electrode 114 is formed on the back surface of the first dopant type semiconductor substrate 100.

Up to this point, an exemplary description for the manufacturing method for a semiconductor device of the present disclosure is finished. In the method, dielectric islands are formed in the process of manufacturing a semiconductor device, and in the process of forming the trenches of the depletion device, since the existence of the dielectric island blocks the ion implantation for the trenches, the ion concentration under the dielectric island is low, such that the breakdown withstand reliability of the device in the on state is greatly improved; and for the formation of the enhanced device, the thickness of the gate dielectric layer increases, reduces the gate capacitance, and reduces the switching loss of the device. Meanwhile, the dielectric islands act as a mask in the process of forming the source regions, so that the steps of photolithography and a photo mask are saved and the process cost is reduced, thereby serving the purpose of improving the stability and breakdown withstand reliability of the device, reducing the gate capacitance, reducing the power loss and saving process costs. It should be understood that, in this embodiment, the steps of forming the second dopant type source regions between the first dopant type source regions, and forming the second dopant type well regions under the first dopant type source regions are merely illustrative, and are not intended to limit the disclosure to the scope of the described embodiments. The protection scope of the present disclosure is defined by the appended claims and equivalent scope thereof.

Embodiment 2

The present disclosure further provides an integrated semiconductor device, the integrated semiconductor device includes a semiconductor device manufactured according to the method described in the Embodiment 1.

The structure of the integrated semiconductor device of the present disclosure will be described illustratively below with reference to FIG. 1G. The integrated semiconductor device includes a first dopant type semiconductor substrate 100. Specifically, the first dopant type semiconductor substrate 100 can be at least one of the following mentioned materials: Si, Ge, SiGe, SiC, SiGeC, InAs, GaAs, InP, InGaAs, or other III/V compound semiconductors, or it further includes multilayer structures made of these semiconductors, or it is silicon on insulator (SOI), stacked silicon on insulator (SSOI), stacked silicon germanium on insulator (S-SiGeOI), silicon germanium on insulator (SiGeOI), germanium on insulator (GeOI), and the like.

It should be noted that the first dopant type and the second dopant type in this specification generally refer to P type or N type. The first dopant type and the second dopant type are opposite. For example, the first dopant type is one of P type, lightly doped P− type, and heavily doped P+ type, and the second dopant type is one of N type, lightly doped N− type, and heavily doped N+ type. Or conversely, the first dopant type is one of N type, lightly doped N− type, and heavily doped N+ type, and the second dopant type is one of P type, lightly doped P− type, and heavily doped P+ type. Exemplarily, the first dopant type semiconductor substrate is an N type lightly doped substrate, that is, an N− substrate, and its doping concentration is $1 \times 10^{14}/cm^3$ to $2 \times 10^{14}/cm^3$.

A first dopant type epitaxial layer 101 is formed on a front surface of the first dopant type semiconductor substrate 100, and the first dopant type epitaxial layer 101 includes a first region 1 and a second region 2. In this embodiment, the first dopant type semiconductor substrate is an N type lightly doped substrate, that is, an N− substrate, and the first dopant type epitaxial layer is an N type lightly doped epitaxial layer, that is, an N− epitaxial layer. Exemplarily, a thickness and resistivity of the first dopant type epitaxial layer 101 will affect a voltage withstand capability of the device. The thicker the thickness of the first dopant type epitaxial layer 101, the greater the resistivity thereof, and the higher the voltage withstand capability of the device. In this embodiment, when the withstand voltage of the formed VDMOS semiconductor device is required to be 650V, the thickness of the first dopant type epitaxial layer 101 is 45 μm to 65 μm, and the resistivity thereof is 15 Ω·cm to 25 Ω·cm.

Exemplarily, the first region 1 is configured to form a depletion device, the second region 2 is configured to form an enhanced device, and the first dopant type epitaxial layer further includes a third region, and the third region is located between the first region and the second region. With continued reference to FIG. 1, the first dopant type epitaxial layer 101 further includes a third region 3, and the third region 3 is located between the first region 1 and the second region 2. Exemplarily, the third region 3 is formed with an isolation structure that isolates the depletion device formed in the first region 1 from the enhanced device formed in the second region 2.

In the following description, the first dopant type epitaxial layer including a first region, a second region, and a third region will be described as an example, in which the first region is configured as a depletion device, and the second region is configured as an enhanced device, and an isolation structure used for isolating the depletion device in the first region from the enhanced device in the second region is provided in the third region. It should be understood that, in this embodiment, providing the depletion device in the first region, providing the enhanced device in the second region, and providing the isolation structure that isolates the depletion device in the first region from the enhanced device in the second region in the third region between the first region and the second region are merely illustrative, and semiconductor devices formed by forming another type of device in the third region or forming another type of device between the first region and the second region without setting the third region are applicable to this disclosure.

Figure 1G:
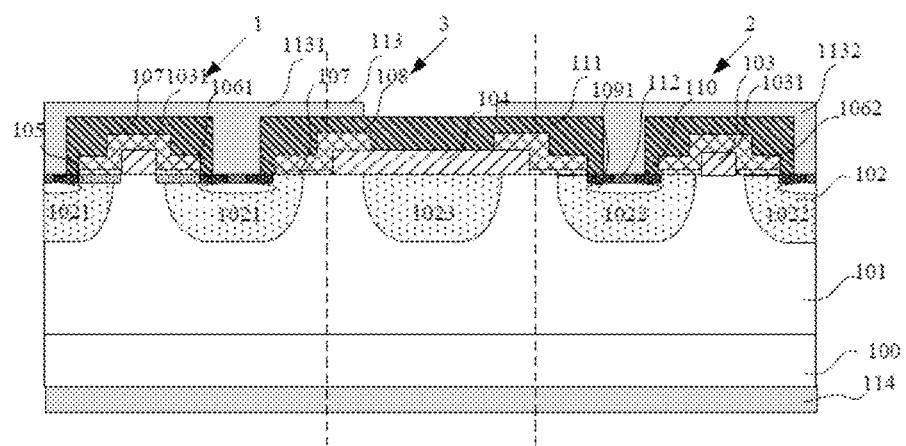

With continued reference to FIG. 1G, the integrated semiconductor device of the present disclosure further includes second dopant type deep wells 102 formed in the first dopant type epitaxial layer 101, the second dopant type deep wells 102 include at least two second dopant type deep wells 1021 located in the first region 1 and at least two second dopant type deep wells 1022 located in the second region 2. In this embodiment, the first dopant type semiconductor substrate is an N type lightly doped substrate, that is, an N− substrate, the first dopant type epitaxial layer is an N type lightly doped epitaxial layer, that is, an N− epitaxial layer, and the second dopant type deep wells are P wells. In an embodiment of the present disclosure, in the epitaxial layer formed with a third region, at least one second dopant type deep well is further formed in the third region. As shown in FIG. 1G, at least one second dopant type deep well 1023 is formed in the third region 3, and the second dopant type deep well 1023 in the third region 3 constitutes a part of the isolation structure.

With continued reference to FIG. 1G, the integrated semiconductor device of the present disclosure further includes gate structures 106 formed on the first region 1 and the second region 2. The gate structures 106 include a gate structure 1061 formed on the first region 1 and a gate structure 1062 formed on the second region 2. The gate structures 106 each include a gate dielectric layer 107 and a gate material layer 108; the gate structure 1061 in the first region 1 partially covers each of the adjacent second dopant type deep wells 1021 in the first region 1, the gate structure 1062 in the second region 2 partially covers each of the adjacent second dopant type deep wells 1022 in the second region 2, dielectric islands 1031 are respectively formed under the gate structures 106, and a part of the dielectric islands 1031 located in the first region 1 covers a region between two adjacent second dopant type deep wells 1021 in the first region, and a part of the dielectric islands 1031 located in the second region 2 covers a region between two adjacent second dopant type deep wells 1022 in the second region 2, and the dielectric islands 1031 are each not in contact with the adjacent second dopant type deep wells 102 (1021 or 1022) at both sides thereof. Since dielectric islands are formed under the gate structures, the ion concentration of the trench of the first dopant type epitaxial layer under the dielectric island is minimized in the process of forming the depletion device, so that the depletion device has higher breakdown voltage and its breakdown withstand reliability is greatly improved. For an enhanced device, according to the formula $C_{ox}=\varepsilon_{ox}/t_{ox}$, it can be determined that the thickness of the gate dielectric layer increases due to the existence of the first dielectric island, which reduces the gate capacitance and reduces the switching loss of the device.

The gate structures 106 and the material of the gate structures can be any materials well known to those skilled in the art. Exemplarily, the gate dielectric layer is a silicon dioxide material, and the gate material layer is a polysilicon material. Exemplarily, a thickness of the gate dielectric layer is in a range of 500 Å to 1500 Å; a thickness of the gate material layer is in a range of 2000 Å to 10000 Å.

In this embodiment, the first dopant type epitaxial layer further includes a third region configured to isolate the first region from the second region. Exemplarily, the semiconductor device further includes a field oxygen covering the second dopant type deep well in the third region. Exemplarily, the field oxygen and the dielectric islands are of the same material layer. With continued reference to FIG. 1C, a field oxygen 104 covering the second dopant type deep well in the third region is formed in the first dopant type epitaxial layer 3 in the third region. The field oxygen 104 covers the second dopant type deep well 1023 of the third region 3 to form a sealing isolation structure. Exemplarily, the field oxygen and the dielectric islands are of the same material layer, and are of silicon oxide material. Exemplarily, the thicknesses of the dielectric islands 103 and the field oxygen 104 are in a range of 5000 Å to 10000 Å, and the lengths of the dielectric islands 103 are in a range of 2 μm to 5 μm.

With continued reference to FIG. 1G, the integrated semiconductor device of the present disclosure further includes first dopant type source regions 110 located in the second dopant type deep wells 102 (1021 or 1022) formed at both sides of each of the gate structures 106, the first dopant type source regions 110 located in one same second dopant type deep well 102 (1021 or 1022) are spaced apart by part of a region of the second dopant type deep well 102 (1021 or 1022).

With continued reference to FIG. 1, the semiconductor device of the present disclosure further includes first dopant type trenches at both sides of the dielectric island 1031 in the first region 1, the first dopant type trenches extend to the first dopant type source regions 110.

Exemplarily, as shown in FIG. 1G, the integrated semiconductor device further includes second dopant type source regions 112 provided respectively in the second dopant type deep wells 1021 in the first region 1 and in the second dopant type deep wells 1022 in the second region 2, and the second dopant type source regions 112 are configured to enhance the contacts between the source electrodes and the deep wells.

Exemplarily, as shown in FIG. 1G, the integrated semiconductor device further includes second dopant type well regions 1091 provided respectively in the second dopant type deep wells 1021 in the first region 1 and in the second dopant type deep wells 1022 in the second region 2. The second dopant type well regions 1091 are located under the first dopant type source regions 110 and the second dopant type source regions 112. Forming the second dopant type well regions 1091 under the first dopant type source regions 110 and the second dopant type source regions 112 can significantly reduce the resistance of the base region of the parasitic transistor, greatly reduce the risk of turning on the parasitic transistor, and significantly improve the working stability of the device.

Exemplarily, as shown in FIG. 1G, the integrated semiconductor device further includes source electrodes formed on the first dopant type epitaxial layer, and the source electrodes 113 include a first region source electrode 1131 and a second region source electrode 1132. The first region source electrode 1131 is in contact with the second dopant type deep wells 1021 in the first region 1 and the first dopant type source regions 110 located in the second dopant type deep wells 1021, and the second region source electrode 1132 is in contact with the second dopant type deep wells 1022 in the second region 2 and the first dopant type source regions 110 located in the second dopant type deep wells 1022, and the first region source electrode 1131 is not in contact with the second region source electrode 1132. Thus, an independent source electrode of the depletion semiconductor device and an independent source electrode of the enhanced semiconductor device are formed. In this embodiment, the second dopant type source regions 112 are formed in the second dopant type deep wells 1021 in the first region 1 and in the second dopant type deep wells 1022 in the second region 2. The first region source electrode 1131 is in contact with the first dopant type source regions 110 and the second dopant type source regions 112 in the first region 1, and the second region source electrode 1132 is in contact with the first dopant type source regions 110 and the second dopant type source regions 112 in the second region 2.

Exemplarily, as shown in FIG. 1G, the integrated semiconductor device further includes a drain electrode 114 formed on a back surface of the first dopant type semiconductor substrate 100. Thus, a complete integrated VDMOS device integrated with a depletion VDMOS device and an enhanced VDMOS device is formed. It should be understood that, the VDMOS device described as an example in this embodiment is merely illustrative and is not intended to limit the scope of the present disclosure. Those skilled in the art may form an IGBT device and the like according to their needs.

Meanwhile, in order to expand the disclosure field and efficiency of the devices, a variety of semiconductor devices can be integrated together as required, for example, further integrating one or more semiconductor devices such as diodes, triodes, resistors, capacitors, JFETs, current-sensing VDMOSs and CMOSs on the above described integrated semiconductor device.

The technical features of the embodiments described above may be arbitrarily combined. To simplify the description, not all possible combinations of the technical features in the above embodiments are described. However, all of the combinations of these technical features should be considered as within the scope of this disclosure, as long as such combinations do not contradict with each other.

The above-described embodiments merely represent several embodiments of the present disclosure, and the descriptions thereof are more specific and detailed, but they should not be construed as limitations to the scope of the present disclosure. It should be noted that, for a person of ordinary skill in the art, several variations and improvements may be made without departing from the concept of the present disclosure, and these are all within the protection scope of the present disclosure. Therefore, the protection scope of the present disclosure shall be subject to the appended claims.

What is claimed is:

1. A manufacturing method for a semiconductor device, comprising:
   providing a first dopant type semiconductor substrate, forming a first dopant type epitaxial layer having a first region and a second region on a front surface of the first dopant type semiconductor substrate;
   forming at least two second dopant type deep wells in each of the first region and the second region, respectively;
   forming a plurality of dielectric islands on the first dopant type epitaxial layer, the dielectric islands including first dielectric islands and second dielectric islands; a part of the first dielectric islands covering a region between two adjacent second dopant type deep wells in the first region, and the other part of the first dielectric islands covering a region between two adjacent second dopant type deep wells in the second region; the first dielectric islands being not in contact with the two adjacent second dopant type deep wells; a part of the second dielectric islands covering part of a region of each of the second dopant type deep wells in the first region, and the other part of the second dielectric islands covering part of a region of each of the second dopant type deep wells in the second region; and the second dopant type deep wells at both sides of each of the second dielectric islands in the first region and the second dopant type deep wells at both sides of each of the second dielectric islands in the second region being regions where first dopant type source regions are to be formed;
   forming first dopant type trenches respectively on the epitaxial layer at both sides of the first dielectric island in the first region, the first dopant type trenches extending to the regions in the first region where first dopant type source regions are to be formed;
   forming gate structures respectively covering the first dielectric islands in the first region and in the second region and on the first dopant type epitaxial layer, the gate structures exposing the second dielectric islands and the regions respectively in the first region and in the second region where first dopant type source regions are to be formed; and
   performing ion implantation for the first dopant type source regions using the gate structures and the second dielectric islands as a mask to form the first dopant type source regions respectively in the first region and in the second region;
   wherein, the first dopant type and the second dopant type are opposite.

2. The manufacturing method according to claim 1, wherein thicknesses of the dielectric islands are in a range of 5000 Å to 10000 Å.

3. The manufacturing method according to claim 1, wherein lengths of the dielectric islands are in a range of 2 µm to 5 µm.

4. The manufacturing method according to claim 1, after the step of forming the first dopant type source regions, further comprising a step of forming source electrodes:
   forming a dielectric layer on the first dopant type epitaxial layer, the dielectric layer covering the gate structures and the first dopant type source regions and exposing the second dielectric islands;
   removing the second dielectric islands and part of the dielectric layer to form openings, the openings exposing part of each of the first dopant type source regions located in the second dopant type deep wells and regions located under the second dielectric islands;
   forming the source electrodes on the first dopant type epitaxial layer, the source electrodes filling the openings;
   wherein, the source electrodes include a first region source electrode and a second region source electrode, the first region source electrode is in contact with the second dopant type deep wells located in the first region and the first dopant type source regions located in the second dopant type deep wells, the second region source electrode is in contact with the second dopant type deep wells located in the second region and the first dopant type source regions located in the second dopant type deep wells, and the first region source electrode is not in contact with the second region source electrode.

5. The manufacturing method according to claim 4, wherein, after forming the first dopant type source regions and before forming the source electrodes, further comprises: forming second dopant type well regions under the first dopant type source regions.

6. The manufacturing method according to claim 4, wherein after removing the second dielectric islands and part of the dielectric layer to form openings and before forming the source electrodes, performing ion implantation for the second dopant type source regions using the remaining dielectric layer as a mask to form second dopant type source regions in regions between the first dopant type source regions; wherein a dosage of the ion implantation for the second dopant type source regions is less than a dosage of the ion implantation for the first dopant type source regions.

7. The manufacturing method according to claim 5, wherein after forming the second dopant type source regions and before forming the source electrodes, forming another second dopant type well regions under the second dopant type source regions, the another second dopant type well regions each are connected to the second dopant type well regions on both sides thereof.

8. The manufacturing method according to claim 1, wherein the first dopant type epitaxial layer further comprises a third region located between the first region and the second region, and at least one second dopant type deep well is formed in the third region while at least two second dopant type deep wells are formed in each of the first region and the second region, respectively.

9. The manufacturing method according to claim 8, further comprising: forming a field oxide covering the second dopant type deep well located in the third region while forming the plurality of dielectric islands on the first dopant type epitaxial layer.

10. The manufacturing method according to claim 1, wherein a thickness of the first dopant type epitaxial layer is 45 µm to 65 µm.

11. The manufacturing method according to claim 1, after forming the dielectric islands and before forming the first dopant type trenches, further comprising a step of a threshold voltage adjusting implantation to adjust a threshold voltage of the device.

12. The manufacturing method according to claim 1, wherein, the gate structures each include a gate dielectric layer and a gate material layer stacked bottom up.

13. The manufacturing method according to claim 12, wherein a thickness of the gate dielectric layer is in a range of 500 Å to 1500 Å, and a thickness of the gate material layer is in a range of 2000 Å to 10000 Å.

14. The manufacturing method according to claim 4, after forming the source electrodes, further comprising: forming a drain electrode on a back surface of the first dopant type semiconductor substrate.

15. The manufacturing method according to claim 1, wherein in the step of performing ion implantation for the first dopant type source regions, an energy of the ion implantation is in a range of 50 KeV to 150 KeV, and a dosage of the implantation is in a range of $5.0\,E15/cm^2$ to $1.0\,E16/cm^2$.

16. The manufacturing method according to claim 6, wherein in the step of performing ion implantation for the second dopant type source regions, an energy of the ion implantation is in a range of 50 KeV to 200 KeV, and a dosage of the implantation is in a range of $5.0\,E14/cm^2$ to $5.0\,E15/cm^2$.

17. The manufacturing method according to claim 1, wherein the semiconductor device comprises VDMOS devices, wherein the semiconductor device located in the first region is a depletion VDMOS device and the semiconductor device located in the second region is an enhanced VDMOS device.

18. The manufacturing method according to claim 1, wherein the forming the second dopant type deep wells comprises:

forming a patterned mask layer on the first dopant type dopant epitaxial layer, the patterned mask layer exposing regions where the second dopant type deep wells are to be formed;

performing an ion implantation for the second dopant type deep wells regions to form second dopant type deep wells on the first dopant type epitaxial layer; and removing the patterned mask layer.

19. The manufacturing method according to claim 18, after the ion implantation for the second dopant type well, further comprising a step of performing an annealing process for the second dopant type deep well, wherein a temperature of the annealing process to the second dopant type well regions is in a range of 1100° C. to 1200° C., and a time thereof is in a range of 60 min to 300 min.

* * * * *